(12) United States Patent
Jansen et al.

(10) Patent No.: US 6,825,591 B2
(45) Date of Patent: Nov. 30, 2004

(54) METHOD FOR CONTROLLING A PIEZOELECTRIC DRIVE AND A PIEZOELECTRIC DRIVE FOR THE IMPLEMENTATION OF THE METHOD

(75) Inventors: Dirk Jansen, Norderstedt (DE); Matthias Baumgartner, Hamburg (DE)

(73) Assignee: Eppendorf AG, Hamburg (DE)

( * ) Notice: Subject to any disclaimer, the term of this patent is extended or adjusted under 35 U.S.C. 154(b) by 0 days.

(21) Appl. No.: 10/268,534

(22) Filed: Oct. 8, 2002

(65) Prior Publication Data

US 2003/0067247 A1 Apr. 10, 2003

(30) Foreign Application Priority Data

Oct. 9, 2001 (DE) .......................................... 101 49 671

(51) Int. Cl.[7] .............................................. H02N 2/06
(52) U.S. Cl. .................................................... 310/317
(58) Field of Search ...................... 310/316.01–316.03, 310/317

(56) References Cited

U.S. PATENT DOCUMENTS

| | | | | |
|---|---|---|---|---|
| 4,641,943 A | * | 2/1987 | Neely .......................... | 396/206 |
| 4,862,207 A | * | 8/1989 | Asakura et al. .............. | 396/261 |
| 5,061,882 A | * | 10/1991 | Takagi ......................... | 318/116 |
| 5,130,619 A | * | 7/1992 | Izuno .......................... | 318/116 |
| 5,138,217 A | | 8/1992 | Wada et al. ................. | 123/498 |
| 5,430,343 A | * | 7/1995 | Takagi ................... | 310/316.02 |
| 5,479,062 A | * | 12/1995 | Yoshino ................. | 310/316.03 |
| 5,895,998 A | * | 4/1999 | Saylor .................... | 310/316.01 |
| 6,100,622 A | * | 8/2000 | Yamamoto et al. ..... | 310/316.01 |
| 6,147,433 A | | 11/2000 | Reineke et al. | |
| 6,236,190 B1 | * | 5/2001 | Hoffmann et al. .......... | 320/166 |
| 6,286,922 B1 | * | 9/2001 | Kondou ....................... | 347/10 |
| 6,366,868 B2 | | 4/2002 | Freudenberg et al. | |
| 6,420,817 B1 | * | 7/2002 | Ricci-Ottati et al. ... | 310/316.01 |
| 6,435,162 B1 | | 8/2002 | Lingl et al. | |
| 6,573,637 B2 | * | 6/2003 | Rueger et al. ......... | 310/316.03 |
| 6,635,977 B2 | * | 10/2003 | Kataoka et al. ............. | 310/116 |

FOREIGN PATENT DOCUMENTS

| | | | |
|---|---|---|---|
| DE | 3522994 | 1/1987 | .......... G05B/11/01 |
| DE | 9921456 | 11/2000 | ........... F02D/41/30 |
| DE | 9927190 | 12/2000 | ............ H02N/2/06 |
| DE | 0027013 | 8/2001 | ............ H02N/2/06 |
| WO | 9937400 | 7/1999 | ............. B01L/3/02 |

\* cited by examiner

Primary Examiner—Thomas M. Dougherty
(74) Attorney, Agent, or Firm—Sidley Austin Brown & Wood, LLP

(57) ABSTRACT

A method for controlling a piezoelectric drive wherein a required voltage to be applied to a piezoactuator for a desired deflection of the piezoactuator is determined by means of the deflection characteristic curve of the piezoactuator, the piezoactuator is supplied with a current by means of a current source, the voltage is measured on the piezoactuator while the piezoactuator is being supplied with the current from the current source, the voltage measured is compared to the voltage required, and the supply of the piezoactuator with the current from the current source is turned off once the required voltage is reached.

16 Claims, 3 Drawing Sheets

METHOD FOR CONTROLLING A PIEZOELECTRIC DRIVE AND A PIEZOELECTRIC DRIVE FOR THE IMPLEMENTATION OF THE METHOD

BACKGROUND OF THE INVENTION

1. Field of the Invention

The invention relates to a method for controlling a piezoelectric drive and a piezoelectric drive suited for the implementation of the method.

2. Description of the Prior Art

Piezoelectric drives can find an application in various fields. An application are proportioning devices, particularly for small volumes proportioned in the nanolitre to millilitre ranges.

WO 99/10099 discloses various microproportioning systems having an open-jet proportioner and/or a microdiaphragm pump. Microdiaphragm pumps and open-jet proportioners have a displacement chamber and a deformable displacement wall or diaphragm associated therewith which can be driven by a piezoelectric actuator. The displacement chamber is connected to a reservoir for the supply of liquid and feeds a proportioning port which can be formed as a nozzle. In a microdiaphragm pump, the liquid flows off or drops out of a proportioning port. In an open jet proportioner, in contrast, the liquid is expelled from the proportioning port in an open jet. From this document, it has been known already to install a fluid module from a reservoir and a displacement chamber in a reception duct of a proportioning device which has an actuator associated with the reception duct which acts on the diaphragm of the module.

WO 99/37400 has made known another microproportioning device which has a proportioning module which is exchangeably arranged in a casing. The proportioning module comprises a proportioning chip with a displacer diaphragm and a pressurized chamber which is connected to a nozzle and a medium reservoir. Also here, the actuator of the microproportioning device and the displacer of the proportioning module are not fixedly connected to each other. Rather, the actuator is merely brought into contact with the displacer. The actuator is a piezoelectric stack actuator ("piezostack") the force of which is transmitted to a pressure point of the proportioning chamber via a rotatably supported lever actuator. The proportioning volume is dependent on the voltage applied to the piezostack. In another embodiment, a control signal U (t) of a low edge steepness is provided to the actuating device at an interval called a suction phase, which causes a slow actuation of the diaphragm out of the initial position. In a proportioning phase, the control signal is brought down to a low level at a very short interval to expel the liquid through the nozzle in an open jet.

The voltage control which has been known before has the disadvantage that the accuracy in deflecting the piezostack does not always satisfy the requirements.

Accordingly, it is the object of the invention to provide a method for controlling a piezoelectric drive at an improved accuracy. In addition, the aim is to provide a suitable piezoelectric drive for implementing the method.

SUMMARY OF THE INVENTION

The object is attained by a method for controlling a piezoelectric drive in which:

a required voltage to be applied to a piezoactuator for a desired deflection of the piezoactuator is determined by means of the deflection characteristic curve of the piezoactuator, the piezoactuator is supplied with a current by means of a current source, the voltage is measured on the piezoactuator while the piezoactuator is being supplied with the current from the current source, the voltage measured is compared to the voltage required, and the supply of the piezoactuator with the current from the current source is turned off once the required voltage is reached.

A piezoelectric drive which is suitable for implementing the method has a piezoactuator, a device for determining a required voltage to be applied to the piezoactuator for a desired deflection of the piezoactuator, a current source connected to the piezoactuator for supplying the piezoactuator with a current, a voltage measuring device connected to the piezoactuator for measuring the voltage on the piezoactuator, a device connected to the voltage measuring device and the device for determining a required voltage to compare the voltage measured and the voltage required, and an electric control device connected to the device for comparing and the current source to turn off the source of the piezoactuator with the current of the current source voltage once the required voltage is reached.

Analyses made on the voltage control, which has been known before, in conjunction with the present invention have revealed that a predetermined voltage will adjust itself only gradually on the piezostack because the latter electrically corresponds to a capacitor so that the voltage will rise according to an exponential function. However, since the deflection of the piezostack is proportional to the voltage the deflection desired will be reached only after a certain time lag. Moreover, the exponential variation of deflection is accompanied by a steadily varying dynamics. The additional undesirable side effect which presents itself in voltage control is a dielectric hysteresis, which makes it very difficult to ascertain the relationship between the voltage applied, dynamics, and deflection. What adds to such effect in the aforementioned embodiment that uses the control signal exhibiting control edges is the change in time of the triggering signal Instead of working with a voltage source, the inventive method and the piezoelectric drive use a current source. The current source features a large internal resistance so as to supply a substantially constant current. The internal resistance of an ideal current source tends to approach infinity. Charging or discharging the piezoactuator with an impressed constant current achieves a linear rise or drop of the voltage on the piezoactuator and, as a result, the gradient or dynamics of this rise or drop is dependent on the driving current strength. Studies made in conjunction with the invention have also shown that this way of triggering avoids or minimizes a hysteresis of the path.

The easiest way of forcing the piezoactuator to effect a defined deflection by means of current control would consist in using a timed current source. The accuracy required for the current source and its timing could be ensured at a relatively low expenditure. However, the voltage arising during the time of current application and, hence, the deflection of the piezoactuator are also a function of piezostack capacitance. More detailed studies have proved that it does not react like an ideal capacitor, but that capacitance varies with the deflection of the piezoactuator with no linear correlation existing between the capacitance and deflection. Furthermore, dependencies of capacitance on the temperature, ageing, and the mechanical bias on the piezoactuator would result in inaccuracies relating to voltage and, hence, to deflection.

Therefore, the invention uses a current source feeding the piezoactuator and measures the voltage which actually is applied to the piezoactuator while the current is being fed. The voltage measured is compared to the voltage required to achieve the desired deflection which can be determined by means of the deflection characteristic curve of the piezoactuator, i.e. the dependence of the piezoactuator deflection on the voltage applied. Once the voltage measured matches the voltage required the piezoactuator is disconnected from the supply and, hence, the desired deflection is exactly achieved. This is the way the piezoactuator may both be charged and discharged to expand or contract the piezoactuator, i.e. to deflect it in various directions.

In this mode of operation, a non-constant capacitance of the piezoactuator still has only a small influence on the dynamics of deflection, but no longer on deflection itself. The accuracy of deflection is primarily governed by the accuracy at which the voltage is measured on the piezoactuator. Such accuracy may be ensured by a calibrated voltage measuring device. In contrast, the current source may basically be operated in an unbalanced state, nor needs the capacitance of the piezoactuator be taken into account in any way. There is no longer any dependence on the capacitance of the piezoactuator that has a tolerance and is not constant in a dynamic mode of operation, nor is there still any dependence on the mechanical bias, state of ageing, and temperature. This significantly improves the accuracy of deflection while maintaining the accuracy of deflection, and reduces the expenditure in manufacture and service. This is an advantage specifically for applications in proportioning devices.

The invention may be generally employed in any piezo-actuators. It is employed with great advantage in piezostacks because the above described capacitance influences are particularly pronounced in piezostacks.

The aspects of the method are as follows:

The dynamics of deflection depends on the current with which the piezoactuator is fed. According to an aspect, the current source is an adjustable current source so that adjusting the current will influence the dynamics of deflection. Adjusting the current source allows to preset a certain dynamics for the entire deflection. The dynamics of deflection may further be influenced by making adjustments during deflection.

According to another aspect, the piezoactuator is controlled in such a way that expansion and contraction are effected at different dynamics. This can be utilized, in particular, for the deformation of the displacement wall of displacement chambers in proportioning devices.

According to an aspect, the piezoactuator acts on a deformable displacement wall of a displacement chamber for proportioning fluids and the deflection of the piezoactuator for a desired proportioning volume of the fluid is determined by means of a proportioning characteristic curve of the displacement chamber and the piezoactuator is controlled accordingly. Thus, the displacement chamber forms part of a piezoelectric drive which causes fluids to be proportioned. The proportioning characteristic curve is the dependence of the displaced fluid volume on the deformation of the displacement wall that can be determined for the displacement chamber.

According to an aspect, the desired proportioning volume is received in and/or expelled from the displacement chamber by means of a single deflection. This is employed for relatively small, lower proportioning volumes which fall below the displacement volume of the displacement chamber. According to another aspect, the desired proportioning volume is received in and/or expelled from the displacement chamber by means of several deflections. This particularly applies to relatively large proportioning volumes which exceed the displacement volume of the displacement chamber.

If the voltage required is not achieved by the voltage measured on the piezoactuator the desired deflection is not achieved either. Therefore, according to an aspect, an error message is generated if the required voltage is not achieved.

The aspects of the piezoelectric drive are as follows:

According to an aspect, the piezoactuator and the electric control device have connected thereto a current source for charging and a further current source for discharging in order to control an expansion and contraction of the piezoactuator.

The voltage measuring device and the device for comparing may be different devices. According to an aspect, the device for determining the required voltage is connected to a differential voltage measuring device and the differential voltage measuring device is connected to the control device in order to switch the current off if the difference voltage from the voltage and the required voltage reaches the zero value. The voltage measuring device and the device for comparing coincide in the differential voltage measuring device.

According to an aspect, the current source and/or the other current source are connected to an electric voltage supply which comprises at least one battery and/or at least one accumulator and/or a power supply unit. According to a further aspect, a high voltage which is required to operate the piezoactuator is produced by a voltage converter of the electric voltage supply.

The supply of electric current into the piezoactuator may be switched on and off in different ways. According to an aspect, an electric switching mechanism is disposed between the electric voltage supply and the current source and/or the further current source and is connected to the electric control device in order to switch on and off the voltage supply of the current source and/or the further current source.

According to an aspect, the electric control device comprises a microcomputer, i.e. it works under the control by a software. According to another aspect, the electric control device is a hardware control unit.

According to an aspect, the piezoelectric drive comprises a displacement wall of a displacement chamber for proportioning liquids in order to expel a fluid from/draw a fluid into the displacement chamber by deforming the displacement wall. The displacement chamber will then form part of the piezoelectric drive which causes fluids to be proportioned. The displacement chamber and further components of a microproportioning device may be designed specifically as described in WO 99/100999 and WO99/37400. The relevant indications in the aforementioned documents are incorporated in this application by reference thereto.

According to a further aspect, devices are provided for inputting a deflection of the piezoactuator and/or a proportioning volume.

Apart from using the method and piezoelectric drive in the proportioning technology, a great variety of further applications thereof are possible in which it matters that the piezoactuator be deflected precisely, particularly in micro-actuator drives.

BRIEF DESCRIPTION OF THE DRAWINGS

More details and benefits of the invention will become apparent from the following description of the accompanying drawings which show an embodiment. In the drawings.

DETAILED DESCRIPTION OF THE PREFERRED EMBODIMENT

Figure 1:
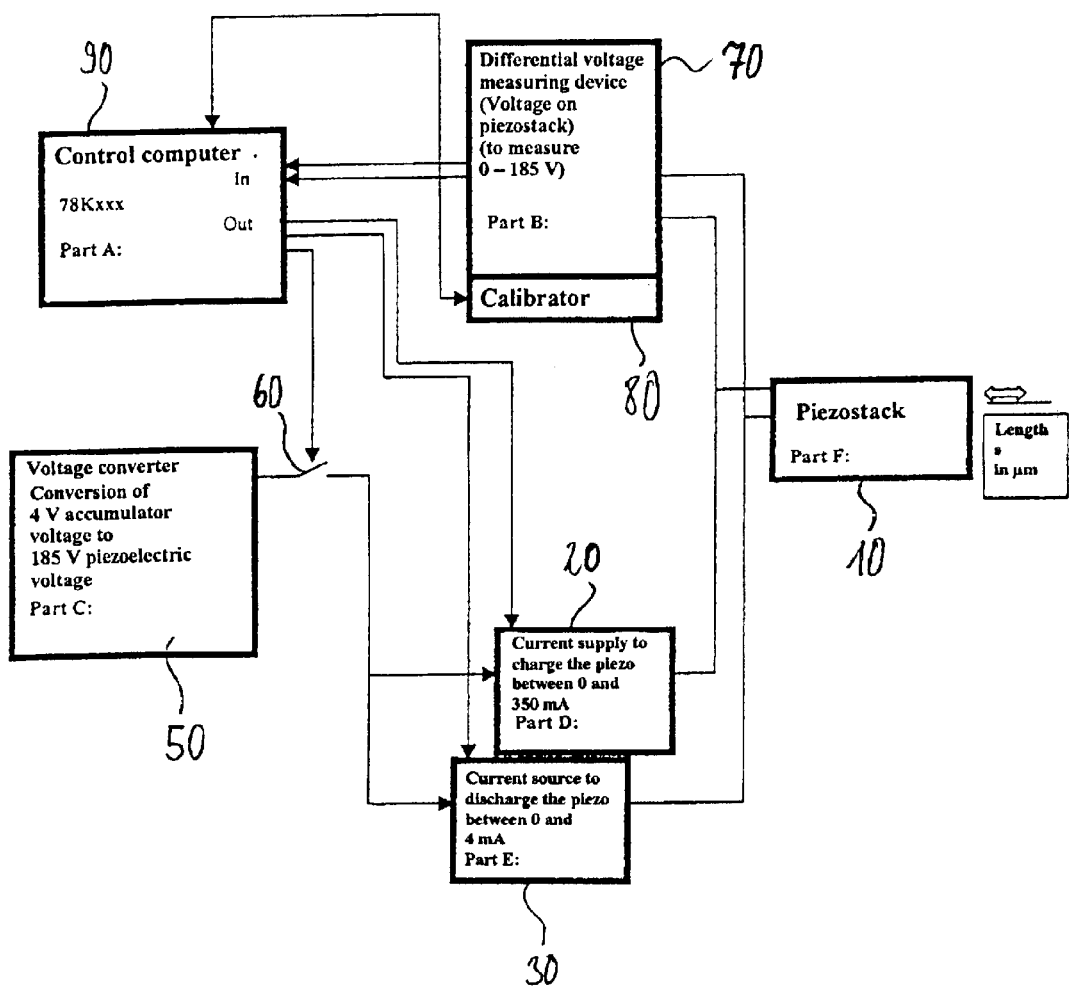
FIG. 1 shows a piezoelectric drive in a roughly schematic block diagram.

The piezoelectric drive comprises a piezostack 10 which can be linearly expanded and contracted by a length s.

It further comprises a current source 20 connected to the piezostack 10 to charge the piezostack. The current source 20 has a current which is adjustable between 0 and 350 mA, for example.

In addition, a further current source 30 connected to the piezostack 10 is provided to discharge the piezostack 10. The further current source is adjustable between 0 and 4 mA, for example.

The current sources 20, 30 are connected to a common digital-analog-converter 40 to adjust the charging and discharging currents.

The current sources 20, 30 are further connected to a voltage converter 50 which converts an accumulator voltage of 4 volts into a piezoelectric voltage of 185 volts. The voltage converter 50 may be designed as a transformer-type converter which chops, transforms, and rectifies the accumulator direct-current voltage at abt. 100 KHz to provide the voltage of 185 volts for the piezostack 10.

The voltage converter 50 is connected to the current sources 20 and 30 via an electric switching mechanism 60.

In addition, a differential voltage measuring device 70 is provided with which a calibrator 80 is associated. The differential voltage measuring device 70 is also connected to the piezostack 10. It comprises a precision comparator 71 for detecting an upper trip point voltage and another precision comparator 72 for detecting an lower trip point voltage. The precision comparators 71, 72 are connected to a two-channel digital-analog-converter 81 of the calibrator 80 via which an upper required voltage and a lower required voltage can be preset. To this effect, the two-channel digital-analog-converter 81 is connected to a voltage reference source 82.

In addition, the two precision comparators 71, 72 are connected to the piezostack 10 via a precision difference amplifier 73, which precision difference amplifier 73 feeds a voltage proportional to the voltage on the piezostack 10 to the precision comparators 71, 72. In addition, a control computer 90 is provided which is a microcontroller of the NEC 78 Kxxxx type, for example. The control computer 90 is connected to the digital-analog-converter 40 of the two power sources 20, 30 to adjust the charging and discharging currents.

The control computer 90 is further connected to the voltage converter 50 in order to control the voltage conversion.

In addition, the control computer 90 is connected to the switching mechanism 60 to open and close the connection of the voltage converter 50 to the current sources 20, 30.

In addition, the control computer 90 is connected to the calibrator 80 to adjust the comparative voltages for the precision comparators 71, 72. Finally, the control computer 90 is connected to the differential voltage measuring device 70 to receive the output signals provided by the precision comparators 71, 72.

Figure 3:
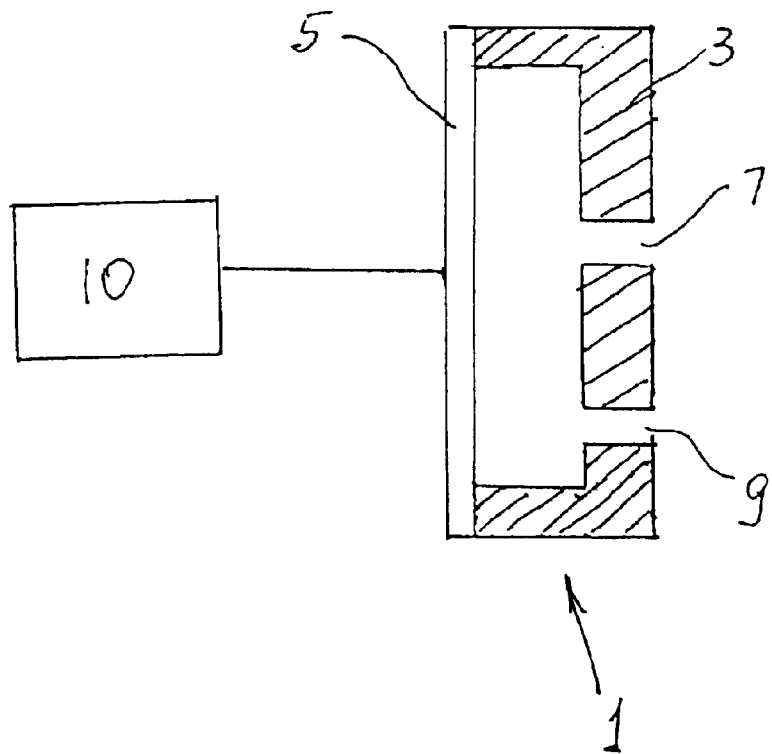
FIG. 3 shows a schematic view of the proportioning chamber in which the piezoelectric drive is used.

The piezoelectric drive is operated, e.g., in conjunction with a displacement chamber of a microproportioning device shown schematically in FIG. 3. The displacement chamber 1 has a casing 3 which, together with a deformable wall 5, define a variable inner chamber. Inlet 7 and outlet 9 are formed in the chamber casing 3. The piezostack 10 displaces the deformable wall 5 in opposite directions as shown with a double arrow. The control computer 90 initially adjusts the charging current of the current source 20 and the discharging current of the current source 30 via the digital-analog-converter 40, according to the respective dynamics desired. In addition, the control device 90 closes the switching mechanism 60, initially connecting the current source 20 to the piezostack 10. The rise of voltage on the piezostack 10 is fed, via the precision difference amplifier 73, to the precision comparator 71 which compares the voltage to a required voltage to which it is preset by the control device 90 via the digital-analog-converter 81. Once the required voltage is achieved the control device 90 is given a signal which indicates that the desired deflection is achieved and releases an interrupt.

Because of the interrupt, the control device 90 switches the current source 20 off and switches the current source 30 on for a change from the charging phase over to the discharging phase. The precision comparator 72 supplied with a required voltage from the control device 90 via the digital-analog-converter 81, when the required voltage to which it is preset is reached, releases another interrupt at the control device 90 that signals the end of the sequence. The piezostack 10 has then contracted by the amount desired and the current source 30 will be switched off by means of the switching mechanism 60.

The voltage measuring device 70 is balanced once during manufacture (by an offset compensation of the difference amplifier 73) and subsequently, upon compensation of the reaction times of the control device 90, an operation of any piezostacks 10 of similar electrical values is possible without any further individual calibration.

An advantage of this mode of operation is that it is unnecessary to accurately determine the electrical data of the piezostack 10 and that changes due to ageing, temperature, etc. are balanced automatically. The accuracy of the current sources 20, 30 still play a role which, however, is minor. The only impact of inaccuracies is that the dynamic behaviour will vary somewhat, but only to such very low degree that no change of the proportioning behaviour will be expected here.

Figure 2:
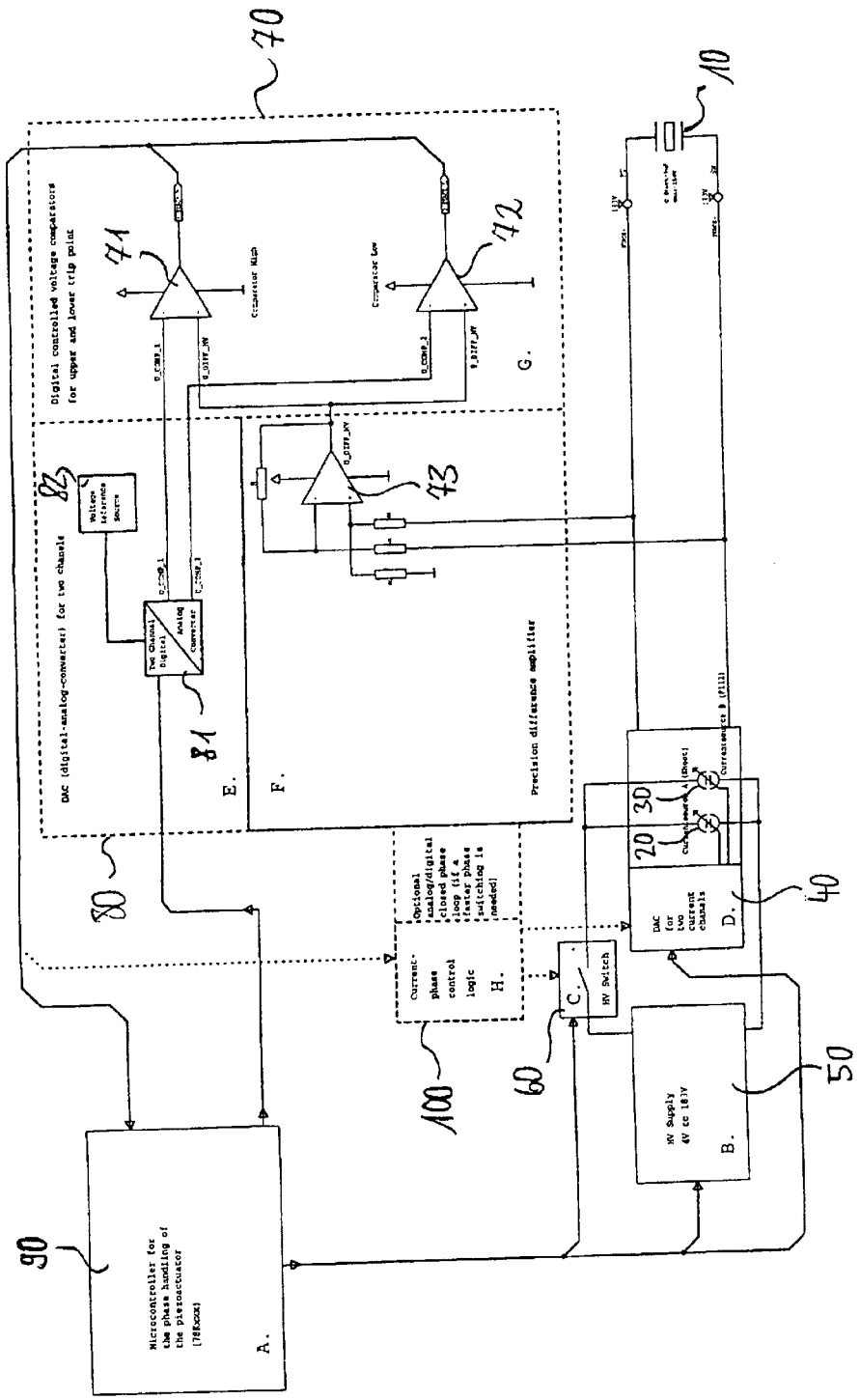
FIG. 2 shows the same piezoelectric drive in a more detailed block diagram.

An additional example of a hardware control is shown in FIG. 2. It comprises a state machine 100 which controls the current sources 20, 30 and the switching mechanism 60 via the digital-analog-converter 40. The state machine 100 is fed with the output signals of the precision comparators 71, 72. The state machine 100 can be a digital or analog control state machine. In this example, the control device 90 merely serves for controlling the calibrator 80 and the voltage converter 50. These functions may also be assumed by a hardware. The curve of current and voltage is the same as that of the above described embodiment including no state machine 100 in which the components 20, 30, 40, 60 are also controlled by the software-controlled control device 90.

What is claimed is:

1. A method for controlling a piezoelectric drive wherein:

a required voltage to be applied to a piezoactuator (10) for a desired deflection of the piezoactuator (10) is determined by means of the deflection characteristic curve of the piezoactuator (10), the piezoactuator (10) is supplied with a current by means of a current source (20, 30), the voltage is measured on the piezoactuator (10) while the piezoactuator (10) is being supplied with the current from the current source (20, 30), the voltage measured is compared to the voltage required, and the supply of the piezoactuator (10) with the current from the current source (20, 30) is turned off once the required voltage is reached, wherein the piezoactuator (10) acts on a deformable displacement wall of a displacement chamber for proportioning fluids and the deflection of the piezoactuator (10) for a desired proportioning volume of the fluid is determined by means of a proportioning characteristic curve of the displacement chamber and the piezoactuator (10) is controlled accordingly.

2. The method as claimed in claim 1, wherein the current source (20, 30) is adjustable.

3. The method as claimed in claim 1, wherein a desired proportioning volume is received in and/or expelled from the displacement chamber by means of a single deflection.

4. The method as claimed in claim 1, wherein the desired proportioning volume is received in and/or expelled from the displacement chamber by means of several deflections.

5. The method as claimed in claim 1, wherein an error message is generated if the required voltage is not reached.

6. The method as claimed in claim 1, wherein the piezoactuator comprises a piezostack.

7. A piezoelectric drive, comprising:

a piezoactuator (10), a device for determining (80) a required voltage to be applied to the piezoactuator (10) for a desired deflection of the piezoactuator (10), a current source (20, 30) connected to the piezoactuator (10) for supplying the piezoactuator (10) with a current, a voltage measuring device (70) connected to the piezoactuator (10) for measuring the voltage on the piezo actuator (10), a device connected to the voltage measuring device (70) and the device for determining a required voltage to compare (70) the voltage measured and the voltage required, and an electric control device (90) connected to the device for comparing (70) and the current source (20, 30) to turn off the supply of the piezoactuator (10) with the current of the current source voltage (20, 30) once the required voltage is reached, wherein the device for determining (80) the required voltage is connected to a differential voltage measuring device (70) and the differential voltage measuring device (70) is connected to the control device (90) in order to switch the current off if the differential voltage from the voltage and the required voltage reaches the zero value.

8. A microproportioning device, comprising:

a displacement chamber having a displacement wall for proportioning liquids in order to expel a fluid from/draw a fluid into the displacement chamber by deforming the displacement wall, and a piezoelectric drive for proportioning liquids and including:

a piezoactuator (10) acting on the displacement wall, a device for determining (80) a required voltage to be applied to the piezoactuator (10) for a desired deflection of the piezoactuator (10), a current source (20, 30) connected to the piezoactuator (10) for supplying the piezoactuator (10) with a current, a voltage measuring device (70) connected to the piezoactuator (10) for measuring the voltage on the piezoactuator (10), a device connected to the voltage measuring device (70) and the device for determining a required voltage to compare (70) the voltage measured and the voltage required, and an electric control device (90) connected to the device for comparing (70) and the current source (20, 30) to turn off the supply of the piezoactuator (10) with the current of the current source voltage (20, 30) once the required voltage is reached.

9. The piezoelectric drive as claimed in claim 8, wherein the piezoactuator (10) and the electric control device (90) have connected thereto a current source (20) for charging the piezoactuator (10) and a further current source (30) for discharging the piezoactuator (10).

10. The piezoelectric drive as claimed in claim 8, wherein the current source (20) and/or the other current source (30) are connected to an electric voltage supply (50) which comprises at least one battery and/or at least one accumulator and/or a power supply unit.

11. The piezoelectric drive as claimed in claim 10, wherein the electric voltage supply (50) comprises a voltage converter.

12. The piezoelectric drive as claimed in claim 10, wherein an electric switching mechanism (60) is disposed between the electric voltage supply (50) and the current source (20) and/or the further current source (30) and is connected to the electric control device (90) in order to switch on and off the voltage supply of the current source (20) and/or the further current source (30).

13. The piezoelectric drive as claimed in claim 8, wherein the electric control device (90) comprises a microcomputer.

14. The piezoelectric drive as claimed in claim 8, wherein the electric control device (90) comprises a hardware control unit (100).

15. The piezoelectric drive as claimed in claim 8, wherein the piezoactuator (10) is a piezostack.

16. The piezoelectric drive as claimed in claim 8, which comprises devices for effecting a deflection of the piezoactuator (10) and/or a proportioning volume.

* * * * *